United States Patent [19]

Moore

[11] Patent Number: 5,995,834
[45] Date of Patent: Nov. 30, 1999

[54] METHOD FOR CONTROLLING CHANNEL RE-SELECTION FROM A SELECTED CONTROL CHANNEL TO AN ALTERNATIVE CONTROL CHANNEL

[75] Inventor: Michael P. Moore, Redmond, Wash.

[73] Assignee: AT&T Wireless Services, Inc., Redmond, Wash.

[21] Appl. No.: 08/772,829

[22] Filed: Dec. 24, 1996

[51] Int. Cl.[6] .................................................. H04Q 7/24
[52] U.S. Cl. .......................... 455/434; 455/429; 455/435; 455/455; 455/552
[58] Field of Search ..................................... 455/435, 455, 455/434, 429, 522, 454, 452, 453

[56] References Cited

U.S. PATENT DOCUMENTS

| | | | |
|---|---|---|---|
| 4,612,415 | 9/1986 | Zdunek et al. .......................... | 455/454 |
| 5,276,905 | 1/1994 | Hurst et al. .............................. | 455/435 |
| 5,353,332 | 10/1994 | Raith et al. ............................. | 455/455 |
| 5,363,428 | 11/1994 | Nagashima .............................. | 455/452 |
| 5,408,684 | 4/1995 | Yunoki et al. .......................... | 455/434 |
| 5,442,680 | 8/1995 | Schellinger et al. . | |
| 5,551,058 | 8/1996 | Hutcheson et al. ..................... | 455/429 |
| 5,754,959 | 5/1998 | Ueno et al. ............................. | 455/453 |
| 5,774,807 | 6/1998 | Yazaki et al. ........................... | 455/434 |
| 5,794,157 | 8/1998 | Haartsen ................................. | 455/522 |

Primary Examiner—William Cumming

[57] ABSTRACT

A method for re-selecting control channels in a mobile station reduces the use of resources by limiting an evaluation of candidate control channels to those channels which satisfy certain criteria and are deemed to be eligible control channels. As a consequence, resources are not spent on attempting to re-select a control channel that is not compatible with the mobile station.

3 Claims, 3 Drawing Sheets

FIG. 2

| CONTROL CHANNEL ID | ELIGIBILITY STATUS | PARAMETER INFORMATION | | |
|---|---|---|---|---|
| | | PRIVATE STATUS | SERVICE DESCRIPTION | ... |
| XXXXX | | PRIVATE | VOICE | ... |
| YYYYY | | PUBLIC | VOICE | ... |
| ZZZZZ | | PUBLIC | FAX | ... |
| ⋮ | ⋮ | ⋮ | ⋮ | ... |
| AAAAA | | PUBLIC | VOICE | ... |

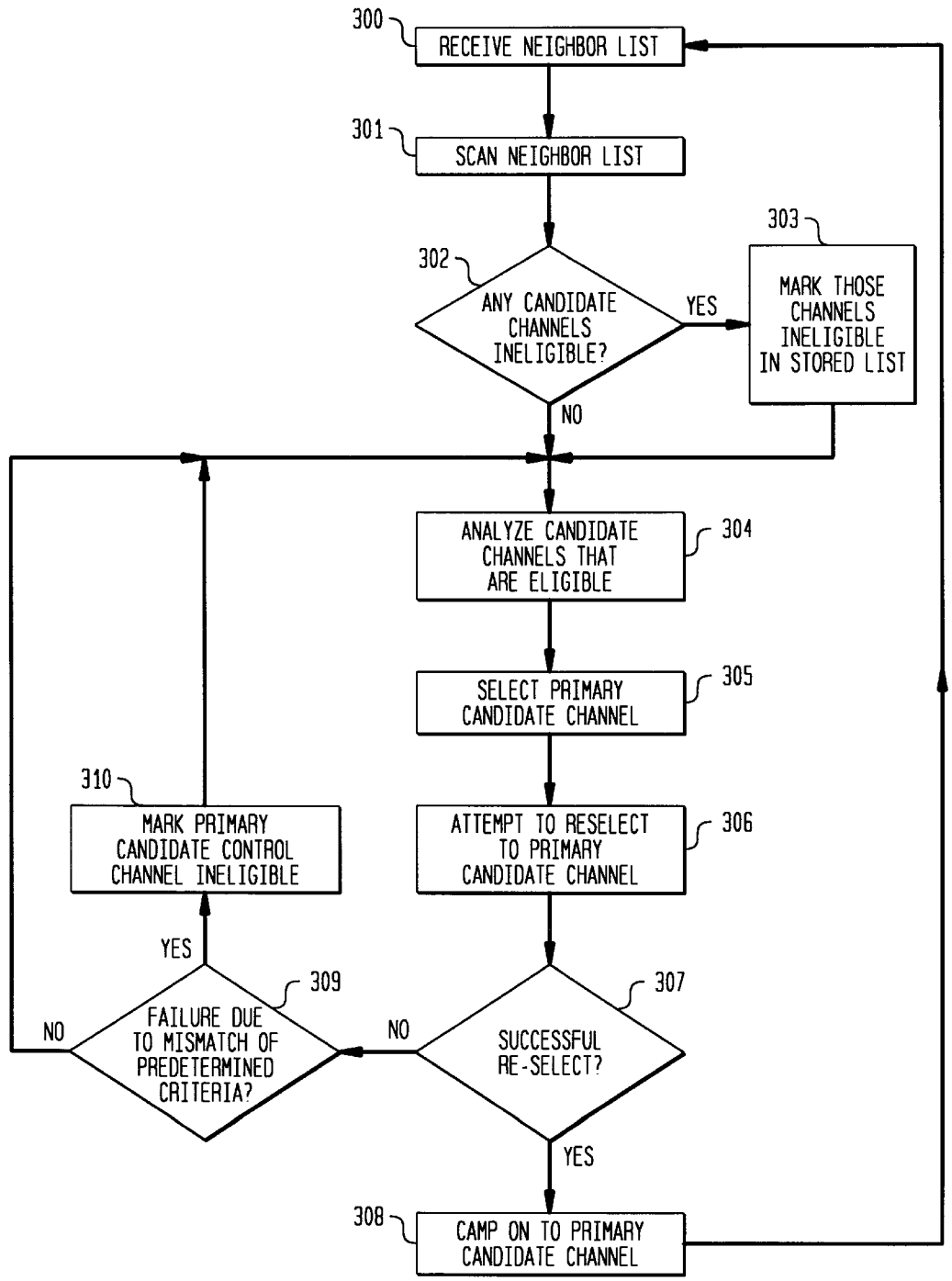

METHOD FOR CONTROLLING CHANNEL RE-SELECTION FROM A SELECTED CONTROL CHANNEL TO AN ALTERNATIVE CONTROL CHANNEL

BACKGROUND OF THE INVENTION

The present invention is directed to a method for controlling control channel re-selection by a mobile communication station. More particularly, the invention relates to allowing the re-selection process to be conducted only with respect to those candidate control channels, onto which the mobile station is eligible to camp.

In the wireless communication environment it is known that as a mobile station moves throughout an area it is likely to encounter different cells that are serviced by different base stations. One example of a multi-cell wireless environment is illustrated in FIG. 1. There are a plurality of cells ($C_1$ to $C_{12}$) and each is served by a separate base station ($BS_1$ to $BS_{12}$). As a mobile station moves from one cell to another cell it is served by a different base station.

Typically the base stations operate with distinct control channels, voice channels or data channels. It is known that during a communication, such as a call, as a mobile station passes from one cell to another it is handed off from one base station to another according to a certain protocol. However, in an activated state where a call is not in process, while the mobile station is in a cell, it is camped on a control channel, i.e., it is in essence tuned to that channel and prepared to engage in communications of control information over that channel. The mobile station must execute a process for selecting another control channel as the mobile station moves from cell to cell. This is called a re-selection process.

In the wireless environment, a known standard referred to as the IS-136 Standard defines protocols for digital wireless communications involving digital mobile stations. That standard defines a process by which the mobile station can re-select a control channel as it moves among the cells. In that process the mobile station is presumed to be "camped-on" to a first control channel. That control channel then transmits a list of the neighboring control channels, that is the list of control channels for the neighboring cells (or service providers). The mobile station receives the list and stores it. Then in accordance with a prescribed algorithm, the mobile station determines which one of the control channels on the list constitutes the primary candidate for re-selection. This determination is made based on such things as reading the RF (Radio Frequency) level of the various control channels in the list and determining which is the control channel that the mobile station should try to select next. For example, if the mobile station was in cell $C_2$ moving towards cell $C_1$, it may detect that the next strongest control channel among the neighbors of cell $C_2$ originates from base station $BS_1$, and therefore would deem that control channel to be the primary candidate for re-selection.

Further, in accordance with the algorithm described in the IS-136 standard once a primary candidate has been determined the mobile station attempts to re-select to that control channel. If that re-selection attempt is successful, then the mobile station camps onto the new control channel, receives a new list of neighboring control channels and begins the process all over with the new list of neighbors. If the attempt is unsuccessful, then the mobile station either selects the next appropriate candidate channel (that is a secondary candidate channel) or repeats the analysis of the entire list of candidate channels attempting to determine another primary candidate channel for re-selection.

A problem arises in that when the mobile station receives the neighbor list, it may include control channels with which the mobile station is simply incompatible. For example, the list may include one or more channels that are related to private systems and a mobile station may not be permitted access to those private systems. Alternatively, the mobile station may be seeking voice service and the control channels may be directed to data or fax services. Nonetheless, based on the parameters used in the analysis algorithm, these control channels with which the mobile station cannot truly interact are included in the analysis operation and one of these incompatible control channels could be selected as the primary candidate control channel. Naturally when this occurs, the attempt to re-select to that control channel will fail. Thus, the execution of the process has wasted time and resources toward the attempt to re-select an incompatible control channel. Furthermore, under the known algorithms, once the attempt to re-select to the incompatible control channel has failed that channel is still included in the next cycle of the re-selection process and could be once again selected as the primary candidate control channel. It is conceivable that the mobile station could get caught in an extended loop of determining an incompatible control channel to be the primary candidate control channel and making a failed attempt to re-select to that control channel.

In view of the shortcomings of the known re-selection process, it is desirable to provide further controls in the re-selection process to avoid the attempt to re-select to incompatible control channels.

It is also desirable to avoid second attempts to re-select to control channels which are determined to be incompatible with the mobile station during a re-select attempt.

SUMMARY OF THE INVENTION

In accordance with the present invention a mobile station performs a method for controlling the re-selection of a control channel. In that method the mobile station, prior to performing any algorithm for selecting a primary candidate control channel, marks as ineligible, any one of the control channels identified on the neighbor list which are incompatible with the mobile station. The selection of a primary control channel then proceeds only with regard to those control channels which are determined to be eligible. Once a primary candidate control channel is selected the mobile station attempts to re-select to that primary candidate control channel. If the attempt to re-select is successful, then the mobile station camps on to this control channel. If, however, the attempt fails, then the mobile station determines why the attempt failed. If the failure arises from an incompatibility between the mobile station and the control channel, then that control channel is marked as ineligible in the neighbor list and when the re-selection process is repeated with the same neighbor list, since that control channel has been marked as ineligible it will not be a factor in the selection of a primary candidate control channel.

Examples of incompatibility are as follows. The mobile station may not have any access privileges with regard to private systems. In this case, the mobile station would scan the neighbor list and mark as ineligible any control channel identified as being related to a private system since the mobile station will not be permitted access to such systems. Alternatively, the mobile station may have access to one private system. In such a case, then if a primary candidate control channel is a private system channel and the mobile station is not determined to have access to that particular private system, then the attempt to re-select to the private system will fail and the neighbor list will be modified to reflect that fact that this channel is not eligible for analysis in a subsequent re-selection process.

BRIEF DESCRIPTION OF THE DRAWINGS

FIG. 2 illustrates a table of information employed by a mobile station in the environment of FIG. 1 to implement the present invention.

FIG. 3 illustrates a process flow for re-selection of a control channel in the wireless channel of FIG. 1 in accordance with an embodiment of the present invention.

DETAILED DESCRIPTION

Figure 1:
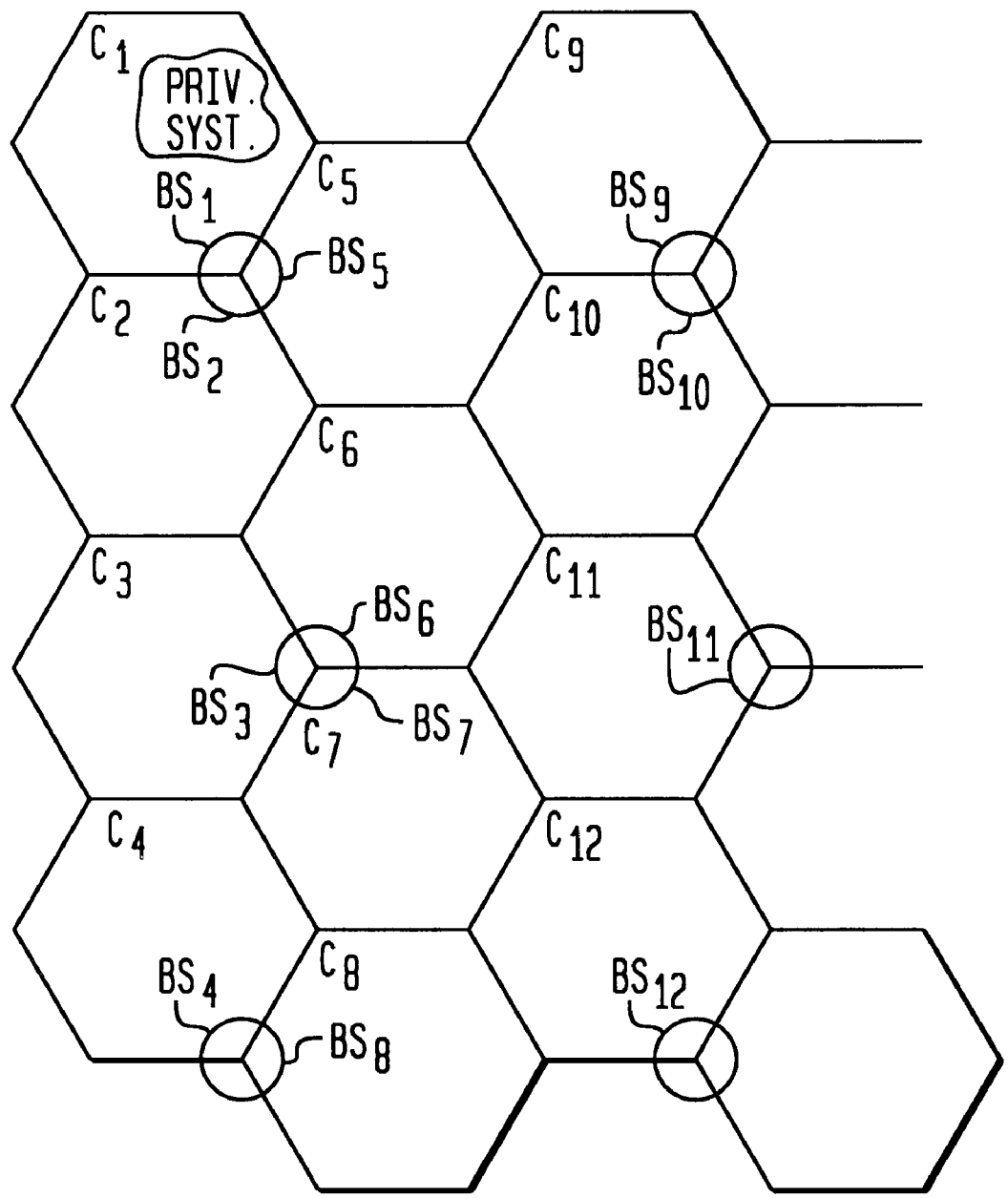
FIG. 1 illustrates in a high level schematic form a wireless system in which the present invention can be employed.

As described above, the mobile station which employs the present invention may be used in a wireless embodiment which is shown schematically in FIG. 1. A cellular phone providing voice service could constitute such a station. A plurality of cells $C_1$ to $C_{12}$ are serviced by respective base stations $BS_1$ to $BS_{12}$. When the mobile station is in cell $C_1$, it may be camped on to the control channel from base station $BS_1$. The control channel $BS_1$, will transmit a list of neighboring control channels. The list will include control channels associated with base station $BS_2$, base station $BS_5$ and base stations that service other cells adjacent to cell $C_1$. Furthermore, the list of neighboring channels may include a list of control channels that are related to fax services or data services. In addition, the list may include a control channel associated with a private system such as that shown in cell $C_1$. Typically such a private system is overlaid by the public system so that the area covered by the private system is covered by both the public and private system, but access to the private system itself, for example, a wireless PBX on a party's premises, is not permissible except by members of that private system.

When the mobile station receives the neighbor list from the control channel on which it is camped, it stores that neighbor list in memory. The mobile station may be a cellular phone which complies with the IS-136 standards. Such a mobile communications device includes processing capabilities and memory, both read only memory (ROM) and random access memory (RAM). The ROM stores control programs for operating the device while the RAM stores dynamic information which can be updated over time, such as the neighbor list transmitted from a control channel on which the station is camped. In its memory the mobile station would track the identification of the control channels included in the list. Furthermore, in compliance with the IS-136 standard, the neighbor list would also provide certain parameter information which relates to the characteristics of the control channel. For example, the parameter information would indicate whether a control channel is associated with a private, a public, or a semi-private system. The identification of the particular system to which the control channel is associated would not necessarily be presented in the neighbor list. Instead only the type of system that the control channel is associated would be supplied. Similarly, the parameter information could indicate whether the control channel is designed to provide voice service, data service, or fax service. Other parameter information which defines the characteristics of the control channel could also be supplied with a neighbor list, (e.g., cell type, protocol version, cell sync, etc.).

An example of a correlation of the information presented by the control channel in which the mobile is camped, is shown in FIG. 2. In this tabular representation of the data which might be stored in the mobile station, a first control channel in the list has an ID of "XXXXX". The parameter information indicates that this control channel is associated with a private system and provides voice services. The control channel identified by "YYYYY" is by contrast associated with the public system while still providing voice services. The control channel "ZZZZZ" is also associated with the public system, but provides fax services. Similar information would be provided for each control channel identified in the neighbor list provided by the control channel on which the mobile station is camped.

This parameter information can then be used to modify or control the process by which an alternative control channel can be selected.

A flow chart illustrating the process for controlling re-selection using the received neighbor list is illustrated in FIG. 3.

In step 300, the mobile station receives the neighbor list from the control channel on which it is presently camped. In Step 301, the mobile station processor scans the neighbor list in accordance with a stored control program and examines the entries in the list to determine whether any of the control channels (the candidate control channels) are ineligible because of a lack of compatibility between the mobile station and the control channel. As an example, incompatibility could arise where the mobile station does not have access to any private network or system. The mobile station memory would store system IDS for those systems with which the mobile station is allowed to communicate. It could also store a flag indicating whether the mobile station has access to any private system. Under those circumstances where there is access to private systems, any control channel which is related to a private system is incompatible with the mobile station. Similarly, if the mobile station seeks voice services, then any control channel associated with fax or data services would be incompatible with the mobile station.

Once a candidate control channel is detected or recognized to be ineligible in Step 302, then each of those ineligible control channels is marked as ineligible in the neighbor list. In particular, the processor in the mobile station modifies the neighbor list to somehow mark a control channel as ineligible. One way of doing this is to include an eligibility flag in the neighbor list. All control channels in the neighbor list would initially have their eligibility flags set as indicating an eligible control channel. Then, when a control channel is marked as ineligible the flag would be reset to an ineligible state. Alternatively, it is possible that other steps could be taken to effectively remove the ineligible control channels from subsequent consideration in the re-selection process. In Step 304, a process, known in the prior art, is initiated for studying or analyzing candidate channels to try to select the optimal candidate channel for re-selection. This process is referred to in FIG. 3, as "analyzing candidate control channels." That step of analysis is limited to only those control channels which are deemed to be eligible. That is, if the eligibility status reflected in the neighbor list in Step 303 indicated that a control channel is ineligible, then that control channel will not be included in the analysis operation beyond that point. It will, in essence, be ignored and will not figure in the calculations of determining the best candidate control channel for the re-selection process. In the analysis operation, each of the eligible control channels will be tested for certain criteria such as RF level. Once each of the eligible control channels is tested a primary candidate channel is selected (step 305) as the processor identifies which of the eligible control channels is the best candidate for re-selection based on the test results obtained during the analysis of step 304. This may arise under the circumstance where the processor will run tests on each of the eligible control channels. As an example a result of the tests on such things as the RF level in step 304 the processor may determine that one or more of the candidate control channel satisfy certain criteria to be selectable by the mobile station. Then, in step 305 the processor could go through this subset of selectable candidate control channels and select the optimal or primary candidate control channel based on the parameters associated with that control channel. Thus, a primary candidate channel could be as in step 305. Once such a primary candidate channel is identified, the mobile station attempts to re-select to the primary candidate channel in Step 306. If the re-selection attempt is successful as detected in Step 307, then the mobile station camps onto the primary candidate channel in Step 308 and receives a new neighbor list from the primary candidate control channel identifying neighbors associated with that control channel. If, however, the attempt to re-select is unsuccessful, then the processor can make a determination as to why the re-selection attempt failed. If the failure is due to a mismatch of certain predetermined criteria as referred to in Step 309, then the channel identified as the primary candidate control channel could then be treated as an ineligible candidate channel. The eligibility status within the neighbor list would be modified to reflect this change of status and the processor could then resume the re-selection process from Step 304, where the processor could begin again the analysis of the candidate control channels focusing only on those which remain as eligible control channels. The system will then select another primary candidate and attempt to re-select to that second primary candidate channel. This process will continue until the mobile station camps onto an alternative control channel.

As has been described above, a candidate channel could be ineligible because the control channel is associated with a private system, whereas the mobile station is not affiliated with any private system. Furthermore, a control channel may be deemed ineligible because of the type of service that it provides and the lack of compatibility between that service and the service of the mobile station. The predetermined criteria referred to in connection with Step 309 can be any condition that causes the failure of a re-select attempt. Typically one such event would be where the primary candidate channel is associated with a private system and the mobile station is also associated with a private system. In that circumstance, then, the primary candidate channel would not then be marked ineligible in Step 303. Then, during the re-select attempt the private system identifier associated with the primary candidate channel would be provided to the mobile station. If the mobile station private system identifier stored in memory does not match the private system ID received from the primary candidate channel during the attempt to re-select, then the mobile station will not get access to the private system associated with that primary candidate channel. Therefore, there is an incompatibility between the mobile station and the system associated with that primary candidate channel. In view of this incompatibility, it is consistent with the present invention to now mark this primary control channel as ineligible as in step 310. Then, if it is necessary to analyze the neighbor list again (step 304) to find a candidate channel for re-selection, the newly designated ineligible control channel will not be analyzed.

In accordance with the present invention, other parameter information associated with a control channel could be used to determine whether the control channel is eligible for re-selection by this particular mobile station. Furthermore, modifications to the process of FIG. 3 are also possible. For instance, in one variation Steps 301, 302 and 303 would be eliminated, that is the processor would not do any preliminary examination of the neighbor list to determine if any candidate channels are ineligible. Instead, the system would simply rely on marking primary candidate channels as ineligible for subsequent re-selection attempts. Alternatively, the control method of the present invention could rely simply on the ineligibility determination made at the beginning of the analysis process and not dynamically evaluate ineligibility based on whether an attempt to re-select a particular candidate channel was successful. Thus steps 309 and 310 could be eliminated and benefits would still be obtained from the remaining process.

Since the present invention resides in a method by which the mobile station selects an appropriate re-selection candidate and since it is implemented using software running on a processor within the mobile station, it must be recognized that variations on the order in which certain steps are performed and the specific techniques or parameters involved in the process could be modified while still falling within the spirit of the present invention. For example, it is conceivable that in one variation the station microprocessor could scan the entire list of neighbors and adjust the eligibility status where appropriate for all ineligible control channels before proceeding with the analysis of the eligible control channels. In an alternative embodiment, the first time through the neighbor list the processor could first determine whether a given control channel is eligible and then, if it is eligible, perform the analysis with respect to that control channel. Then the microprocessor would turn to the next control channel on the list, determine whether it should be considered eligible and if so conduct the evaluation with respect to that control channel and so on. In this second configuration, the processor does not scan the entire list before beginning the evaluation process. Instead, it combines the marking and evaluation steps.

Other modifications might include other techniques for marking a control channel as ineligible.

In yet another embodiment it is conceivable that the mobile station could select for analysis a subset of the control channels from the neighbor list; the subset being based on any one or combination of parameters.

In accordance with the present invention, a mobile station can more optimally control the process by which it selects alternative control channels. It provides the mobile station with a way to focus only on those candidate control channels with which the mobile station can effectively communicate.

What is claimed is:

1. In a wireless communication environment in which a mobile station camps on to a selected control channel and can select an alternative control channel on which to attempt to camp, a method comprising the steps of:

receiving a list of candidate control channels at the mobile station over the control channel on which the mobile station is currently camped;

analyzing said list to determine a primary candidate channel for re-selection;

attempting to re-select said primary candidate channel;

if the attempt to re-select fails because the primary candidate channel corresponds to a private system to which the mobile station is not permitted access, then marking the primary candidate channel as ineligible for re-selection such that during a subsequent attempt to re-select the control channel marked as ineligible is not considered.

2. The method of claim 1 wherein a candidate control channel is marked as ineligible in said list if it is associated with a private system, said step of analyzing further comprising the steps of:

determining if a candidate control channel has been marked ineligible; and considering only those control channels that have not been marked ineligible.

3. The method of claim 1 wherein a control channel is marked as private in said list of candidate control channels if it is associated with a private system, said step of analyzing further comprising the steps of:

determining if a candidate control channel is marked as private in said list of potential control channels; and considering said control channel for re-selection only if said mobile station has a private system identification stored in a memory.

* * * * *